US006708230B2

(12) United States Patent
Shin

(10) Patent No.: US 6,708,230 B2
(45) Date of Patent: Mar. 16, 2004

(54) RELATIVE ADDRESS ALLOCATION APPARATUS AND METHOD FOR DATA STORAGE CARD

(75) Inventor: Hyun-Bae Shin, Kyungki-do (KR)

(73) Assignee: LG Electronics, Inc., Seoul (KR)

( * ) Notice: Subject to any disclaimer, the term of this patent is extended or adjusted under 35 U.S.C. 154(b) by 375 days.

(21) Appl. No.: 09/766,830

(22) Filed: Jan. 23, 2001

(65) Prior Publication Data

US 2001/0009536 A1 Jul. 26, 2001

(30) Foreign Application Priority Data

Jan. 24, 2000 (KR) ............................. 2000-3213

(51) Int. Cl.[7] .................. G06F 12/06; G06F 13/10; G06F 13/14
(52) U.S. Cl. .................. 710/9; 710/3; 710/8; 710/301
(58) Field of Search ................... 710/2–4, 8–10, 710/36, 74, 300–302; 713/1, 2, 100

(56) References Cited

U.S. PATENT DOCUMENTS

| 5,511,013 A | * | 4/1996 | Tokieda et al. ............. 713/321 |
| 5,581,787 A | * | 12/1996 | Saeki et al. ................ 710/9 |
| 5,634,075 A | * | 5/1997 | Smith et al. ................ 710/9 |
| 5,774,701 A | * | 6/1998 | Matsui et al. ............. 713/501 |
| 5,909,591 A | * | 6/1999 | Brooke ..................... 710/9 |
| 5,974,554 A | * | 10/1999 | Oh .......................... 713/300 |
| 6,055,596 A | * | 4/2000 | Cepulis ..................... 710/104 |
| 6,098,132 A | * | 8/2000 | Olarig et al. ............... 710/302 |
| 6,279,114 B1 | * | 8/2001 | Toombs et al. .............. 713/300 |

FOREIGN PATENT DOCUMENTS

| JP | 59-050947 | * | 10/1985 |
| JP | 61-285521 | * | 12/1986 |

* cited by examiner

*Primary Examiner*—Ilwoo Park
(74) *Attorney, Agent, or Firm*—Birch, Stewart, Kolasch & Birch, LLP

(57) ABSTRACT

An apparatus and method allocate relative card addresses (RCAs) for multimedia cards in a digital data player with a multimedia card stack configured to receive those multimedia cards. Respective slot positions of the multimedia cards inserted in the multimedia card stack can be recognized, thereby allowing respective RCAs to be allocated for the position-recognized multimedia cards. The apparatus includes a number of multimedia cards inserted in the slots and adapted to download and/or upload data under a control of a multimedia card controller using a relative card address. The multimedia card controller sequentially outputs clock control signals, each adapted to supply a clock signal to only one of the slots selected by that clock control signal. A relative address is then allocated to the multimedia card inserted in the selected slot in response to the clock control signal. A number of switches are used to selectively supply the clock signal to one of the multimedia cards in response an associated clock control signal, while preventing the clock signal from reaching the remaining multimedia cards.

12 Claims, 4 Drawing Sheets

RELATIVE ADDRESS ALLOCATION APPARATUS AND METHOD FOR DATA STORAGE CARD

BACKGROUND OF THE INVENTION

1. Field of the Invention

The present invention relates to a technique for allocating respective relative addresses of data storage media in a digital data player, and more particularly to an apparatus and method for allocating relative addresses for a plurality of multimedia cards in a digital data player with a multimedia card stack configured to receive those multimedia cards.

2. Description of the Related Art

One type of digital data player is an MP3 player which is a portable digital appliance capable of easily downloading desired data via a computer communication network and reproducing the downloaded data, using an audio data compression coding technique without using a tape or compact disc (CD). In particular, such an MP3 player exhibits little or no failures while having a good reproduction quality because it is configured to store reproduction files in the form of digital data. Also, the MP3 player has a light and miniature structure, so that it exhibits a superior portability and is capable of being carried during exercise. By virtue of such features, MP3 players are desirable substitutes for portable cassette players and CD players.

For such MP3 players, there are diverse types of storage media Separable multimedia cards (MMCs) are one type of such media mainly used as storage media for MP3 players.

FIG. 1 is a view illustrating the configuration of a general multimedia card. Referring to FIG. 1, the multimedia card 5 includes seven connection ports, that is, a clock port or terminal CLK, a data port or terminal DAT, a command/response port or terminal CMD, three power terminals $V_{SS1}$, $V_{SS2}$, and $V_{DD}$, and a redundancy port NC. The terminals CMD, CLK, and DAT compose a 3-line serial data bus. Signals received at the terminals CMD, CLK and DAT are inputted to a card interface controller 13 via an interface driver 12 so as to control the inputting and outputting of data to and from a memory 15. Typically, the memory 15 of the multimedia card 5 comprises a ROM and a flash memory. A set of registers 16 are electrically connected to the card interface controller 13.

The command/response terminal CMD serves as a bi-directional command channel so that it is used for transmission of a card initialization signal and a data transmission command. A signal transmitted on the command/response terminal CMD, namely, a CMD signal, has two operation modes, that is, an open-drain mode for initialization, and a push-pull mode for a rapid command transmission. A command is sent from a multimedia card bus master to the multimedia cards whereas a response is sent from each multimedia card to a host The data terminal DAT is a bi-directional data channel. A signal transmitted on the data terminal DAT, namely, a DAT signal, operates in a push-pull mode. Such a DAT signal is driven by only one of an associated multimedia card or the host.

FIG. 2 is a block diagram schematically illustrating the configuration of a conventional multimedia card stack. Referring to FIG. 2, N multimedia cards 11A to 11N are illustrated, each of which includes a plurality of connection ports NC, CMD, $V_{SS1}$, $V_{DD}$, CLK, $V_{SS2}$, and DAT, a memory adapted to store data therein and a card interface controller adapted to write data on the memory and to read out the stored data from the memory. The multimedia card stack is configured to allow the multimedia cards 11A to 11N to be connected to a multimedia card controller 10 included in an MP3 player, in which the multimedia card stack is located, while sharing a system bus. Not all slots in the stack need contain a card, and the cards need not be inserted into the slots in any particular order.

The multimedia card controller 10 is connected to a personal computer (PC) 40. When the PC 40 outputs a control command to the multimedia card controller 10, this multimedia card controller 10 reads out data from a selected one of the multimedia cards 11A to 11N in response to the control command, and outputs the read data to an MP3 decoder 20. The decoded data generated from the MP3 decoder 20 is then outputted in the form of an analog signal via a digital analog converter (DAC) 30.

A multimedia card system using multimedia cards 11 A to 11N mentioned above includes slots for inserting those multimedia cards (i.e., a multimedia stack provided with those slots) and a multimedia card controller for writing data on a memory included in a selected one of the multimedia cards, and reading out the stored data.

Now, a procedure for allocating different relative addresses to the multimedia cards of the multimedia card stack in accordance with an operation of the multimedia card controller will be described. Each of the multimedia cards 11A to 11N downloads data supplied from the multimedia card controller of the MP3 player or uploads data, already downloaded, via a reverse path. These cards share the ports associated with the downloading or uploading of data, and lines on a system bus, i.e., the clock line CLOCK, the command line COMMAND, and the data line DATA.

For such data downloading or uploading operations, all multimedia cards 11A to 11N in the multimedia card stack are allocated different relative card addresses (RCAs) by the multimedia controller in an initialization procedure, respectively. In this procedure, the relative address allocation is begun from the multimedia card of the cards 11A to 11N exhibiting a more rapid response to a command from the multimedia controller than the other cards.

In accordance with this relative address allocation method, it is impossible for the multimedia card controller to recognize respective relative addresses allocated for the multimedia cards inserted in particular slots of the multimedia card stack. In other words, although the multimedia card controller can recognize the number of multimedia cards inserted in the multimedia card stack, it cannot recognize respective positions within the stack and relative addresses of the cards inserted in the slots. For this reason, one drawback is that it is impossible to inform the user of respective positions of multimedia cards inserted in the multimedia card stack. In other words, the multimedia card to be accessed is determined in a random fashion irrespective of the intention of the user.

SUMMARY OF THE INVENTION

Accordingly, the present invention is directed to a technique for allocating respective relative addresses of data storage media in a digital data player that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In accordance with one aspect, the present invention provides relative address allocation apparatus for a digital data player having a plurality of slots respectively adapted to receive multimedia cards, including at least one multimedia card inserted in the slots and adapted to download or upload data, a plurality of switches each adapted to selectively supply a clock signal to an associated slot in response to an associated clock control signal; and a multimedia card controller to sequentially output clock control signals to the plurality of switches so as to sequentially select the slots, and to allocate a relative address for any multimedia card inserted in the selected slot.

In accordance with another aspect, the present invention provides a relative address allocation method for a digital data player having a plurality of slots adapted to receive multimedia cards, including outputting a clock control signal to one of the slots from a controller; tuning on a switch connected to the one slot, in accordance with the outputted clock control signal; and determining whether or not there is a multimedia card inserted in the one slot connected to the turned-on switch.

In accordance with another aspect, the present invention provides a relative address allocation method for a digital data player having a plurality of slots adapted to receive multimedia cards, said slots being connected to a common bus, the method including selecting one of the slots; connecting a terminal of the selected slot to the common bus; and assigning a relative address to any multimedia card present in the selected slot.

Therefore, it is an advantage of the present invention to allocate relative addresses to a plurality of multimedia cards in a digital data player one by one, so that respective positions of the multimedia cards inserted in the slots can be recognized thereby allowing respective RCAs to be allocated for the position-recognized multimedia cards.

It is to be understood that both the foregoing general description and the following detailed description are exemplary and explanatory and are intended to provide further explanation of the invention as claimed.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

As mentioned above, a multimedia card system includes slots for inserting multimedia cards, i.e., a multimedia stack provided with those slots. Such a system also includes a multimedia card controller for writing data on a memory included in a selected one of the multimedia cards, and reading out the stored data. Each multimedia card is electrically connected to the multimedia card controller by insertion in one of the slots. The present invention applies to a digital data player including such a multimedia card system.

Figure 1:
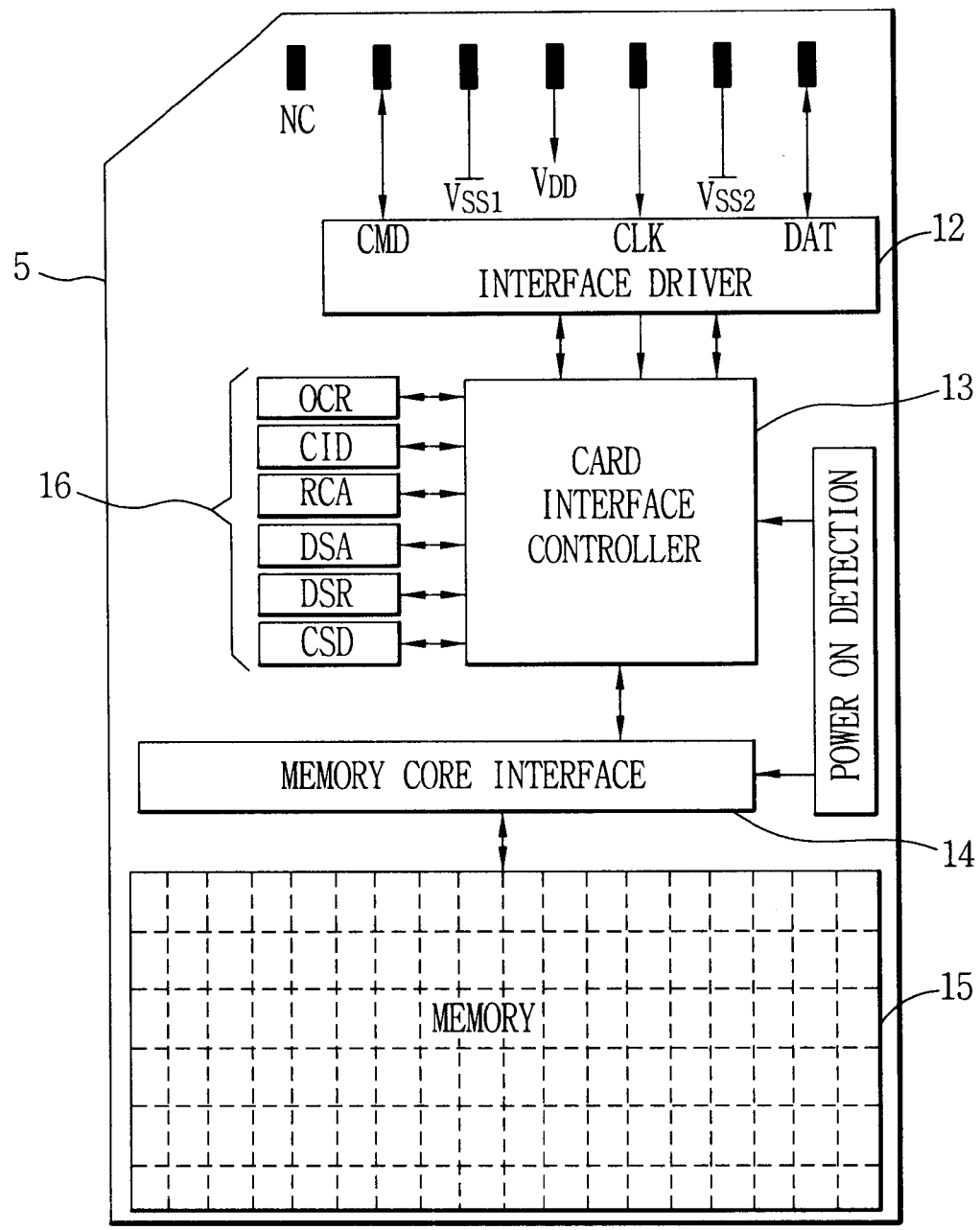
FIG. 1 is a view illustrating the configuration of a general multimedia card.
Figure 2:
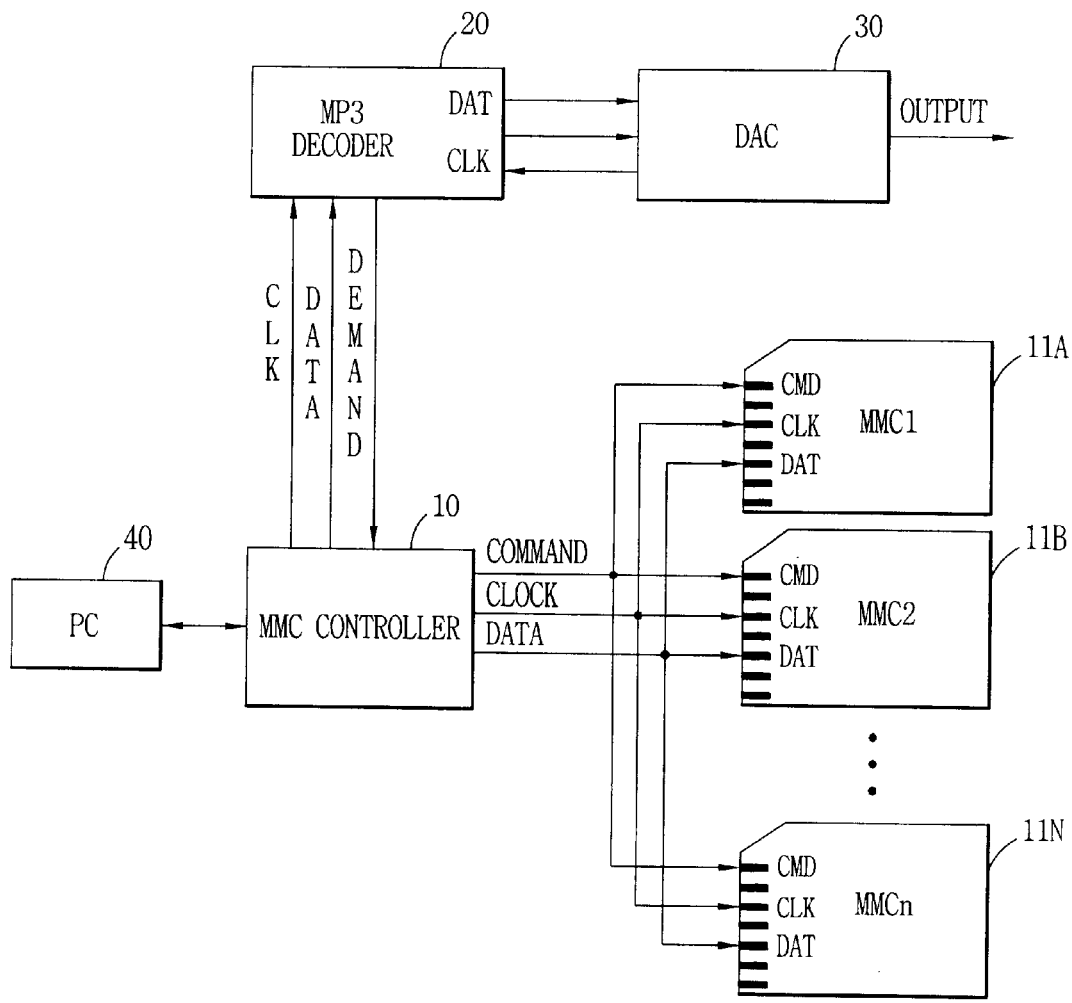
FIG. 2 is a block diagram schematically illustrating a conventional multimedia card system.
Figure 3:
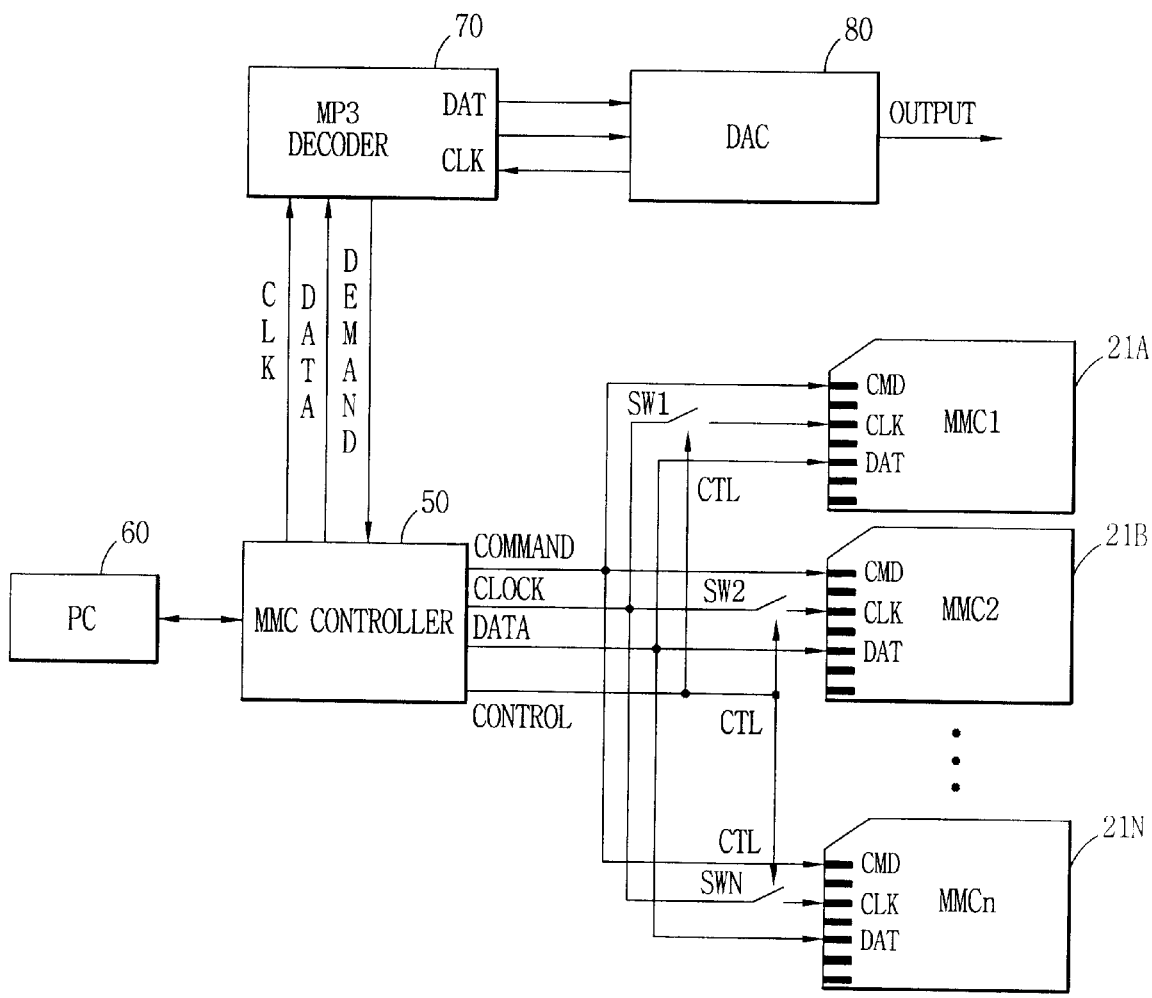
FIG. 3 is a block diagram illustrating a multimedia card system to which a relative address allocation apparatus according to the present invention is applied.

FIG. 3 illustrates a relative address allocation apparatus for a digital data player according to an embodiment of the present invention. As shown in FIG. 3, the relative address allocation apparatus includes a plurality of multimedia cards 21A to 21N, and a multimedia card controller 50 for inputting and outputting data from and to a selected one of the multimedia cards 21A to 21N to drive an MP3 player in which the multimedia card controller 50 is installed. Under the control of the multimedia card controller 50, each of the multimedia cards 11A to 11N downloads data which is externally supplied, and uploads data, already downloaded, via a reverse path. Each of the multimedia cards 21A to 21B includes a plurality of connection ports NC, CMD, $V_{SS1}$, $V_{DD}$, CLK, $V_{SS2}$, and DAT, a memory adapted to store data therein, and a card interface controller adapted to write data on the memory and to read out the stored data from the memory. The relative address allocation apparatus also includes a plurality of switches SW1 to SWN, each adapted to selectively supply a clock signal to an associated one of the multimedia cards 21A to 21N in response to an associated one of clock control signals CTL1 to CTLn outputted from the multimedia card controller 50. Though illustrated in FIG. 3 as being on a single bus for the sake of convenience, the control signals CTL1 to CTLn are each implemented on individual lines, enabling exclusive switching. In response to an MP3 file reproduction command generated by the user, the multimedia card controller 50 reads out data from a selected one of the multimedia cards 21A to 21N associated with the reproduction command, and outputs the read data to an MP3 decoder 70. The MP3 decoder 70 decodes the data, and sends the decoded data to a DAC 80 which, in tuna converts the digital data to analog data The resultant analog data is output from the DAC 80.

The multimedia cards 21A to 21B are inserted in multimedia card slots (not shown) included in a multimedia stack (not shown), respectively.

Figure 4:
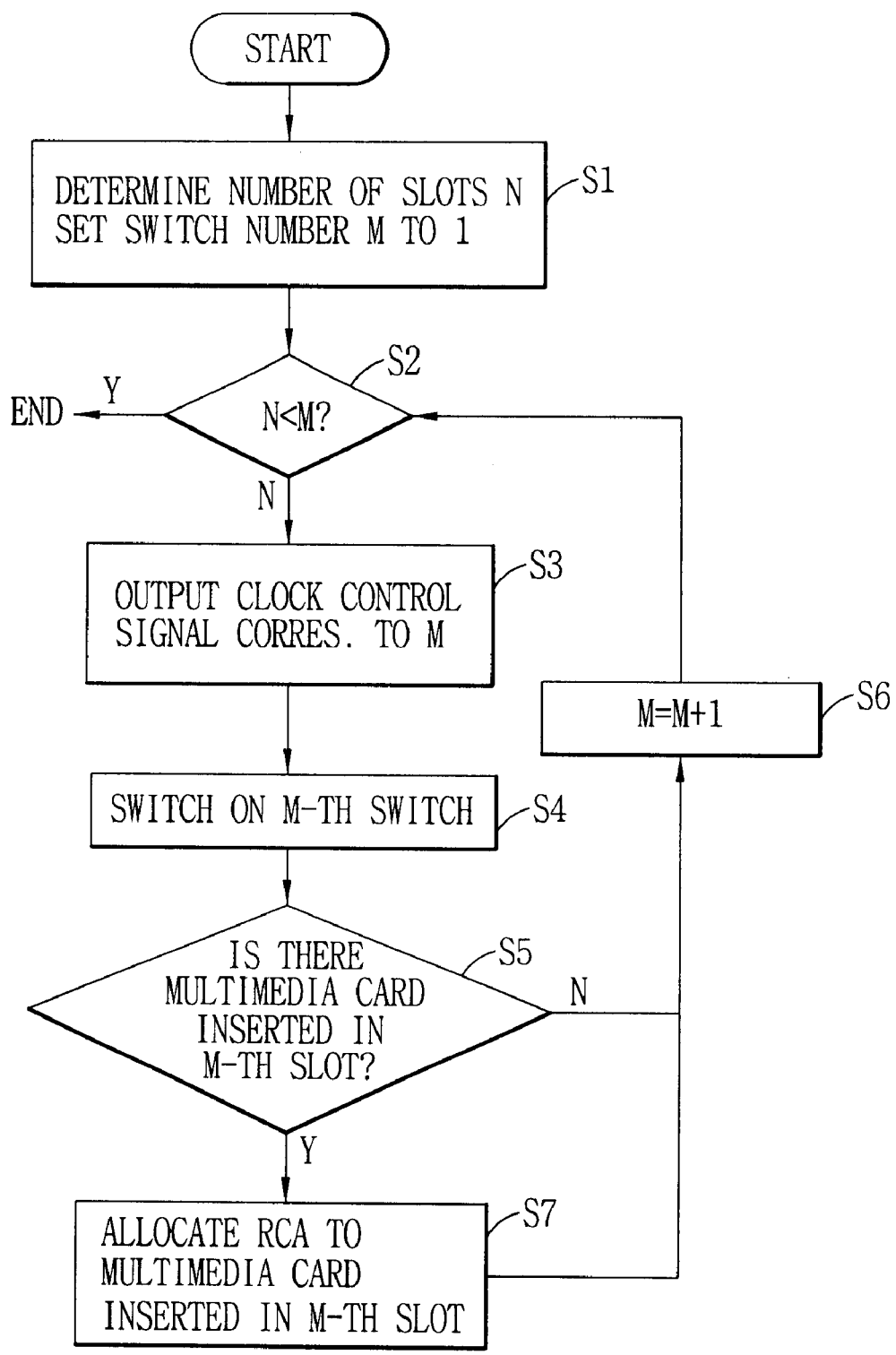
FIG. 4 is a flow chart illustrating a relative address allocation method according to the present invention.

A relative address allocation method carried out using the above mentioned a relative address allocation apparatus in accordance with the present invention will be described in conjunction with FIG. 4. In accordance with the relative address allocation method, the number of slots in the multimedia stack used is initially determined to be, "N" (Step S1). Also in step S1, the number of a switch selected to be currently switched on, M, is initially set to "1" Thereafter, whether or not the number of slots, N, is less than the number of the selected switch, M, is determined (Step S2). When it is determined at step S2 that the number of slots, N, is less than the current switch number M, the routine is ended. On the other hand, when it is determined at step S2 that the number of slots, N, is not less than the switch number M, the routine proceeds to step S3. At step S3, a clock control signal CTLn adapted to turn on the switch corresponding to the switch number M is outputted from the multimedia card controller 50.

In response to the outputted clock control signal, the switch corresponding to the switch number M is switched on at step S4. Accordingly, the clock signal CLK is supplied from the multimedia card controller to the M-th slot connected to the M-th switch currently switched on. The controller 50 then determines whether or not there is a multimedia card inserted in the M-th slot (Step S5). Where there is no multimedia card inserted in the M-th slot, M is incremented by one (M=M+1) (Step S6). Thereafter, the routine is returned to step S2 in order to repeat the above procedure for the next slot On the other hand, when there is a multimedia card inserted in the M-th slot, a command for the allocation of a relative address is transmitted to the multimedia card via the command line CMD, so that a relative address is allocated for the M-th multimedia card (Step S7). Following step S7, the routine is returned to step S6 in order to repeat the above procedure for the next slot After repeating the procedures of steps S2 to S6 for all slots, i.e., when N<M, the routine is ended.

Each of the Multimedia cards 21A to 21N downloads data supplied from the multimedia card controller 50 installed at the MP3 player or uploads data, already downloaded, via a reverse path. These cards 21A to 21N also share ports associated with the downloading or uploading of data, and lines on a system bus, i.e., a clock line CLOCK a command line COMMAND, and a data line DATA. For such a data downloading or uploading operation, all multimedia cards 21A to 21N in the multimedia card stack are allocated with different RCAs by the multimedia card controller 50 in an initialization procedure. This initialization procedure may be executed in response to a manipulation of the user depressing an initialization button after the supply of electric power to the MP3 player, or may be executed automatically upon insertion of a card stack into the player.

The multimedia card controller 50 controls the ON/OFF operations of the switches SW1 to SWN connected in series to respective clock ports CLK of the multimedia cards 21A to 21N, using clock control signals CTL1 to CTLn respectively. In accordance with such a control of the multimedia card controller 50, a relative address corresponding to a slot number is allocated for the multimedia card inserted in the slot corresponding to the slot number.

In the initialization procedure, for example, the multimedia card controller 50 first switches on the switch SW1 connected in series between the clock line CLOCK of the system bus and the clock port CLK of the multimedia card 21A inserted in the first slot, using a clock control signal CTL1. Simultaneously, the 5 multimedia card controller 50 switches off the remaining switches SW2 to SWN, using clock control signals CTL2 to CTLn.

As a result, a clock signal is supplied only to the first multimedia card 21A without being supplied to the remaining multimedia cards 21B to 21N. In this state, the multimedia card controller 50 transmits a command for the allocation of a relative address via the command line COMMAND of the system bus. The remaining multimedia cards 21B to 21N cannot respond to this relative address allocation command. Only the multimedia card 21A responds to the relative address allocation command. Thus, the multimedia card 21A is allocated a relative address corresponding to the associated slot.

Thereafter, the multimedia card controller 50 switches on the switch SW2 connected in series between the clock line CLOCK of the system bus and the clock port CLK of the multimedia card 21B inserted in the second slot, using a clock control signal CTL2, while switching off the remaining switches SW1 and SW3 to SWN, using clock control signals CTL1 and CTL3 to CTLn.

Accordingly, the clock signal is supplied only to the second multimedia card 21B without being supplied to the remaining multimedia cards 21A and 21C to 21N. In this state, the multimedia card controller 50 transmits the relative address allocation command via the command line COMMAND of the system bus. The multimedia cards 21A and 21C to 21N cannot respond to this relative address allocation command Only the multimedia card 21B responds to the relative address allocation command. Thus, the multimedia card 21B is allocated with a relative address corresponding to the associated slot The above procedure is repeated for the remaining slots, thereby sequentially selecting the multimedia cards inserted in those slots, and allocating, to the selected multimedia cards, relative addresses corresponding to associated slots.

Thus, the multimedia card controller included in the digital data player having a stack structure capable of receiving a plurality of multimedia cards can sequentially designate the multimedia cards to be accessed based on clock control signals. In this manner different relative addresses are sequentially allocated to the designated multimedia cards.

As apparent from the above description, the present invention provides an apparatus and method for allocating relative addresses for a plurality of multimedia cards in a digital data player with a multimedia card stack. The multimedia cards correspond to slots included in the multimedia card stack and are adapted for insertion into the slots. The respective positions of the multimedia cards thus inserted in the slots can be recognized thereby allowing respective RCAs to be allocated for the position-recognized multimedia cards. Accordingly, the present invention is capable of informing the user of respective positions of multimedia cards in the multimedia card stack of the digital data player.

It will be apparent to those skilled in the art that various modifications and variations can be made in the iris recognition system according to the present invention without departing from the spin it or scope of the invention. For example, although the selection of card slots and assigning of relative addresses has been described as "sequential," those skilled in the art will appreciate that other orders could be used Thus, it is intended that the present invention cover the modifications and variations of the invention provided they come within the scope of the appended claims and their equivalents.

What is claimed is:

1. A relative address allocation apparatus for a digital data player having a plurality of slots respectively adapted to receive multimedia cards, comprising:
   at least one multimedia card inserted in the slots and adapted to download and upload data;
   a plurality of switches each adapted to selectively supply a clock signal to an associated slot in response to an associated clock control signal; and
   a multimedia card controller to sequentially output clock control signals to the plurality of switches so as to sequentially select the slots in order to determine whether or not any one of the multimedia cards is present in the selected slot, and if one of the multimedia cards is determined to be present in the selected slot, the multimedia controller allocates a relative address for the multimedia card inserted in the selected slot,
   and while the clock signal is supplied to one of the slots, the clock signal is not supplied to any of the other slots.

2. The relative address allocation apparatus according to claim 1, wherein each of the switches is connected between a clock line included in a system bus and a clock terminal included in an associated slot.

3. The relative address allocation apparatus according to claim 1, wherein the clock control signals are generated in response to a command for initializing the digital data player.

4. The relative address allocation apparatus according to claim 2, wherein each of the switches is connected to a clock port of any multimedia card present in a respective slot.

5. A relative address allocation method for a digital data player having a plurality of slots, each of the slots being adapted to receive any one of a plurality of multimedia cards, comprising:

outputting a clock control signal to one of the slots from a controller;

turning on a switch connected to the one slot, in accordance with the outputted clock control signal; and determining whether or not one of the multimedia cards is inserted in the one slot connected to the turned-on switch, wherein step of outputting the clock signal is performed for only one of the slots at a time.

6. The relative address allocation method according to claim 5, further comprising:

transmitting a relative address allocation command from the controller to the multimedia card if the determining step determines that one of the multimedia cards is inserted in the one slot.

7. The relative address allocation method according to claim 6, further comprising:

allocating a relative address for the associated multimedia card in accordance with the transmitted relative address allocation command.

8. The relative address allocation method according to claim 5, wherein the outputting, turning on, and determining steps are repeated for all of the slots in a sequential fashion.

9. A relative address allocation method for a digital data player having a plurality of slots, each of the slots being adapted to receive any one of a plurality of multimedia cards, said slots being connected to a common bus, the method comprising the following steps:

detecting at least one multimedia card inserted in the slots and adapted to download and upload data;

controlling a plurality of switches, each being adapted to selectively supply a clock signal to an associated slot in response to an associated clock control signal, wherein each of the switches is controlled by sequentially outputting the clock control signals to the plurality of switches so as to sequentially select the slots; and determining whether or not any one of the multimedia cards is present in a selected slot, and if one of the multimedia cards is determined to be present in the selected slot, the multimedia controller allocates a relative address for the multimedia card inserted in the selected slot, and while the clock signal is supplied to one of the slots, the clock signal is not supplied to any of the other slots.

10. The relative address allocation method according to claim 9, further comprising the step of connecting each of the switches between a clock line included in a system bus and a clock terminal included in the associated slot.

11. The relative address allocation method according to claim 9, further comprising the step of generating the clock control signals in response to a command for initializing the digital data player.

12. The relative address allocation method according to claim 10, further comprising the step of connecting each of the switches to a clock port of any multimedia card present in a respective slot.

* * * * *